(12) United States Patent
Khakifirooz et al.

(10) Patent No.: US 12,224,015 B2
(45) Date of Patent: Feb. 11, 2025

(54) STAGGERED ACTIVE BITLINE SENSING

(71) Applicant: Intel Corporation, Santa Clara, CA (US)

(72) Inventors: Ali Khakifirooz, Brookline, MA (US); Rezaul Haque, El Dorado Hills, CA (US); Dhanashree Kulkarni, El Dorado Hills, CA (US); Bayan Nasri, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 785 days.

(21) Appl. No.: 17/236,651

(22) Filed: Apr. 21, 2021

(65) Prior Publication Data

US 2022/0343982 A1 Oct. 27, 2022

(51) Int. Cl.
*G11C 16/24* (2006.01)
*G11C 16/04* (2006.01)
*G11C 16/26* (2006.01)

(52) U.S. Cl.
CPC .......... *G11C 16/24* (2013.01); *G11C 16/0483* (2013.01); *G11C 16/26* (2013.01)

(58) Field of Classification Search
CPC ...... G11C 16/24; G11C 16/0483; G11C 16/26
See application file for complete search history.

(56) References Cited

U.S. PATENT DOCUMENTS

| | | | | |
|---|---|---|---|---|
| 6,507,525 | B1* | 1/2003 | Nobunaga | G11C 7/12 365/189.11 |
| 9,202,581 | B1 | 12/2015 | Kamei | |
| 2010/0302868 | A1 | 12/2010 | Han et al. | |
| 2011/0090740 | A1* | 4/2011 | Lee | G11C 16/26 365/185.03 |
| 2013/0279251 | A1 | 10/2013 | Chul et al. | |
| 2017/0228189 | A1 | 8/2017 | Lee | |
| 2019/0267080 | A1* | 8/2019 | Natarajan | G11C 16/10 |
| 2021/0074338 | A1 | 3/2021 | Khakifirooz et al. | |
| 2021/0265988 | A1* | 8/2021 | Chen | H03K 19/20 |

OTHER PUBLICATIONS

Extended European Search Report for European Patent Application No. 22153892.9, mailed Jun. 29, 2022, 8 pages.

* cited by examiner

*Primary Examiner* — Edward J Dudek, Jr.
(74) *Attorney, Agent, or Firm* — Jordan IP Law, LLC (57) ABSTRACT

Systems, apparatuses and methods may provide for technology that applies a first set of control signals to even bitlines in NAND memory and senses voltage levels of the even bitlines during an even sensing time period. The technology may also apply a second set of control signals to odd bitlines in the NAND memory, and sense voltage levels of the odd bitlines during an odd sensing time period, wherein the second set of control signals are applied after expiration of a stagger time period between the even sensing time period and the odd sensing time period.

20 Claims, 6 Drawing Sheets

STAGGERED ACTIVE BITLINE SENSING

TECHNICAL FIELD

Embodiments generally relate to memory structures. More particularly, embodiments relate to staggered active bitline (ABL) sensing in memory structures.

BACKGROUND

Multi-level NAND-type flash memory ("NAND memory") may be organized into multiple cells, with each cell containing multiple bits of data and being accessible through an array of bit lines (columns) and word lines (rows). In such a case, the number of bits per cell may depend on how many distinct voltage levels can be achieved during program operation(s). For example, to support two bits per cell, four voltage levels may be called for in order to distinguish between the four possible combinations of ones and zeros (11, 01, 00, 10). Additionally, the threshold voltage ($V_t$) of a given cell may be indicative of the data that is stored in the cell. As the number of different read levels increases to, for example, penta-level cell (PLC) encoding (e.g., covering thirty-two voltage levels in a 5V range), even a slight threshold voltage shift can result in the wrong level being read. Moreover, in current reading schemes, the threshold voltage of neighboring bitlines can significantly affect the apparent threshold voltage of the selected bitline. As a result, read errors may be encountered, which has a negative impact on performance.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

Figure 1:
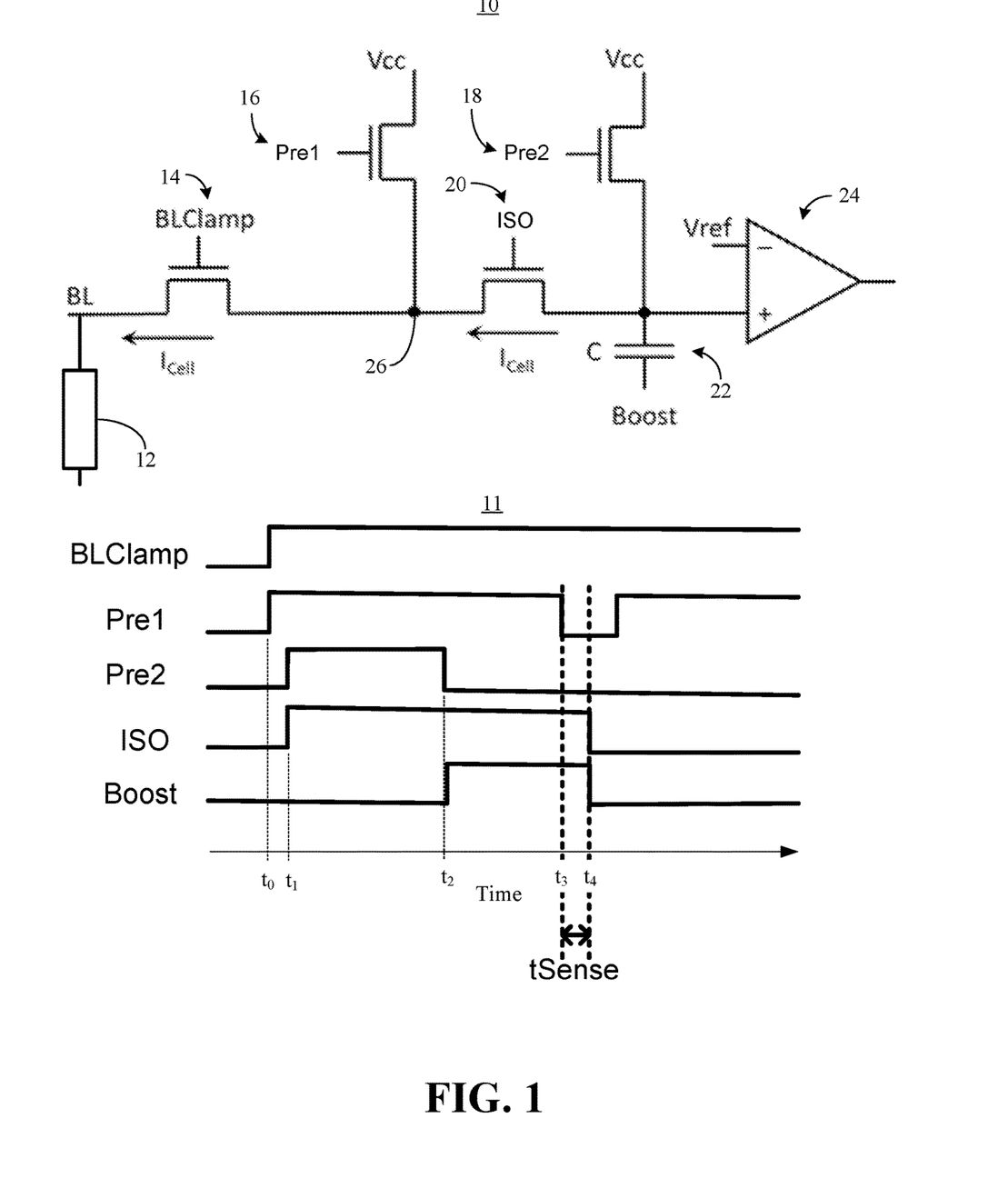
FIG. 1 is a schematic diagram with conventional control signal waveforms for an example of sensing circuitry.

Turning now to FIG. 1, sensing circuitry 10 and a conventional active bitline (ABL, also referred to as all bitline) signaling scheme 11 is shown for a bitline (BL) that is coupled to a string 12 of NAND memory cells. In the illustrated example, a bitline clamp ("BLClamp") transistor 14 and a first pre-charge ("Pre1") transistor 16 are activated at time $t_0$, which causes current to flow from $V_{cc}$ through the first pre-charge transistor 16 and the bitline clamp transistor 14 and precharge the bitline. At time $t_1$, a second pre-charge ("Pre2") transistor 18 and an isolation ("ISO") transistor 20 are activated to precharge a sensing capacitor 22 and continue to precharge the bitline. The second pre-charge transistor 18 may be deactivated at time $t_2$, along with the application of a boost voltage to the sensing capacitor 22. The operation to precharge the bitline will continue until time $t_3$ so that the BL voltage is substantially stable and the current through the BL is equal to the cell current ($I_{Cell}$).

In the illustrated example, the first pre-charge transistor 16 is deactivated at time $t_3$, which begins a sense time period ($t_{sense}$) for a comparator 24. Thus, depending on the threshold voltage of the selected NAND memory cell in the string 12, the cell may sink current from the sensing capacitor 22 during the sense time period. Additionally, if the voltage at a node 26 drops too low during the sense time period, the illustrated first pre-charge transistor 16 will turn on to minimize the drop in the BL voltage and coupling to neighboring bitlines. At time $t_4$, the isolation transistor 20 may be deactivated and the comparator 24 may determine the difference between the voltage across sensing capacitor 22 and a reference voltage ($V_{ref}$). Because the voltage across the sensing capacitor 22 is proportional to the amount of current sinked from the sensing capacitor 22, the illustrated comparator 24 is able to determine whether the value of the cell is a zero or a one.

In the illustrated example, all bitlines are pre-charged simultaneously and sensing occurs at the same time on all bitlines. As will be discussed in greater detail, the threshold voltage of neighboring bitlines can significantly affect the apparent threshold voltage of the selected bitline in the illustrated solution. Indeed, as the number of different read levels increases to, for example, PLC encoding (e.g., covering thirty-two voltage levels in a 5V range), even a slight threshold voltage shift can result in the wrong level being read. As a result, read errors may be encountered, which has a negative impact on performance.

Figure 2:
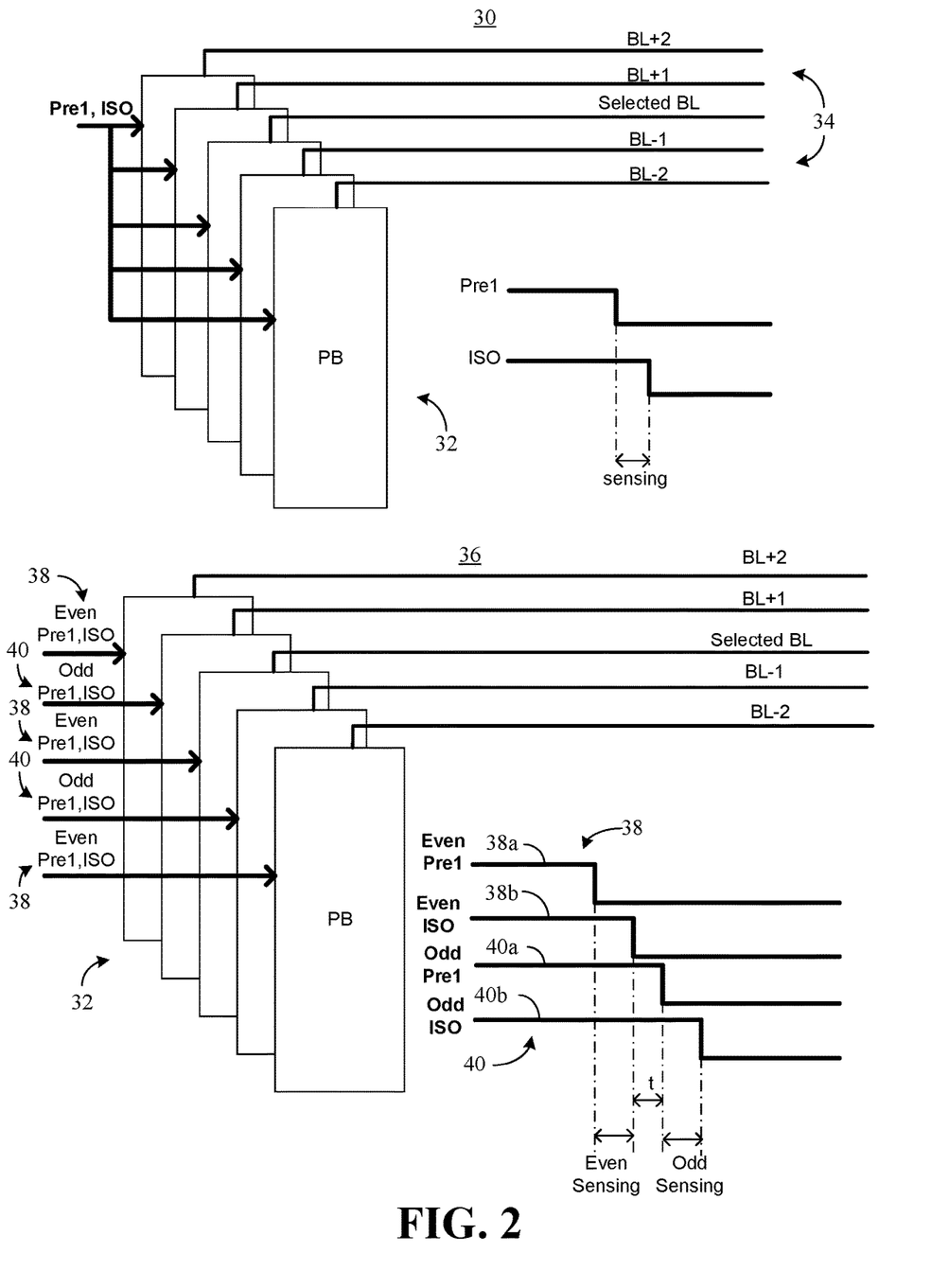
FIG. 2 is a comparative block diagram with corresponding control signal waveforms for an example of a conventional control scheme and a control scheme according to an embodiment.

FIG. 2 shows a conventional solution in which a set of page buffers (PBs) 32 (e.g., including sensing circuitry, latches, etc.) receive a single set of pre-charge and isolation control signals that are applied to all bitlines 34. By contrast, an enhanced solution 36 applies a first set of control signals 38 (38a, 38b) to even bitlines in NAND memory and a second set of control signals 40 (40a, 40b) to odd bitlines in the NAND memory. In an embodiment, the second set of control signals 40 are applied after expiration of a stagger time period ("t", representing the amount of staggering applied) between the even sensing time period and the odd sensing time period. In one example, application of the second set of control signals 40 after expiration of the stagger time period reduces noise in the even bitlines and the odd bitlines. The stagger time period may also significantly reduce the read time relative to shielded active bitline (ABL) sensing.

More particularly, the first set of control signals 38 may include an even pre-charge signal 38a that is shared by even pre-charge transistors and an even isolation signal 38b that is shared by even isolation transistors. In the illustrated example, the even pre-charge signal 38a deactivates the even pre-charge transistors (e.g., causing cell current to be sinked from even sensing capacitors) and the even isolation signal 38b deactivates the even isolation transistors after the even pre-charge transistors have been deactivated (e.g., causing the even sensing capacitors to be isolated from the memory cells). Additionally, the second set of control signals 40 may include an odd pre-charge signal 40a that is shared by odd pre-charge transistors and an odd isolation signal 40b that is shared by odd isolation transistors. In an embodiment, the odd pre-charge signal 40a deactivates the odd pre-charge transistors and the odd isolation signal 40b deactivates the odd isolation transistors after the odd pre-charge transistors have been deactivated. The illustrated enhanced solution 36 is advantageous relative to shielded ABL sensing because the entire signaling scheme 11 (FIG. 1) does not need to be repeated a second time for the odd bitlines. Rather, the negligible stagger time period is inserted between the even sensing time period and the odd sensing time period.

Figure 3:
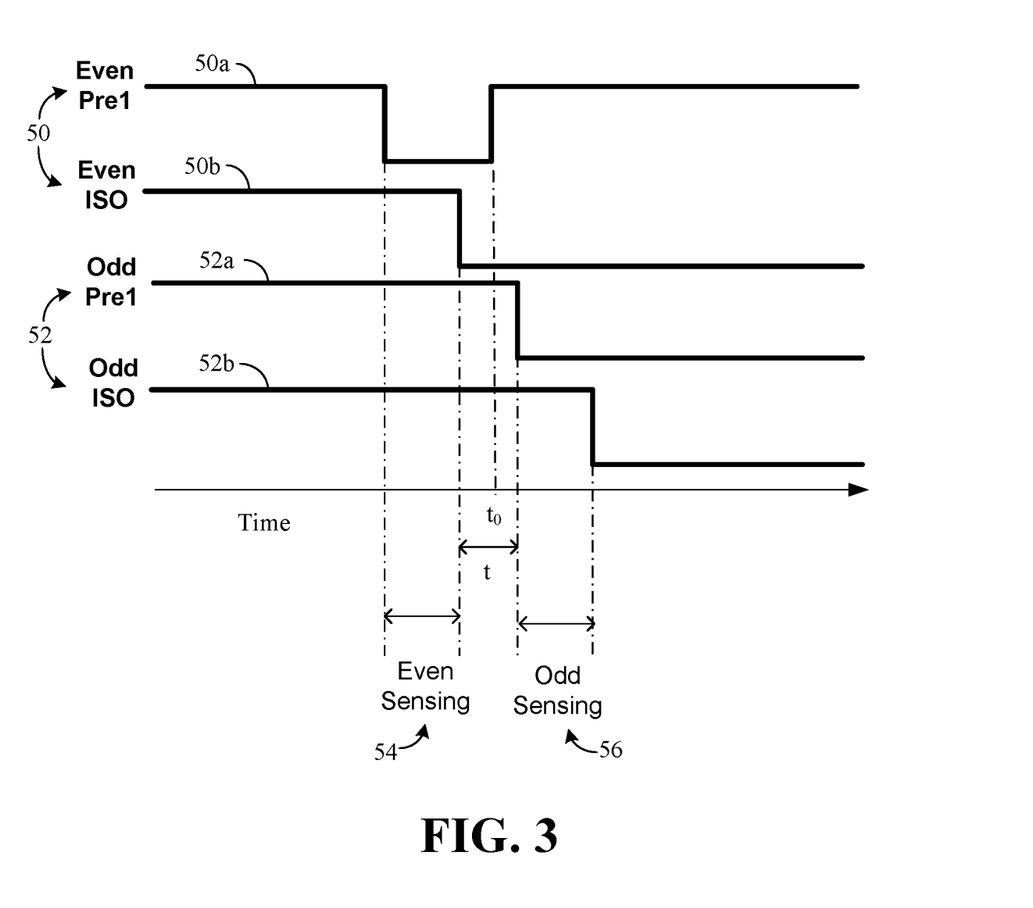
FIG. 3 is a control signal waveform diagram for an example of a control scheme according to an alternative embodiment.

FIG. 3 shows an alternative signaling approach in which an even pre-charge signal 50a of a first set of control signals 50 (50a, 50b) activates even pre-charge transistors from a deactivated state at time $t_0$ during the stagger time period before a second set of control signals 52 (52a, 52b) are applied to odd bitlines. The illustrated solution eliminates any mismatch that may be present between the sensing of the even bitlines and the odd bitlines. More particularly, an odd pre-charge signal 52a is high during the even sensing period 54 and the even pre-charge signal 50a is high during the odd sensing period 56. Such an approach may further enhanced performance through more accurate read operations.

Figure 4:
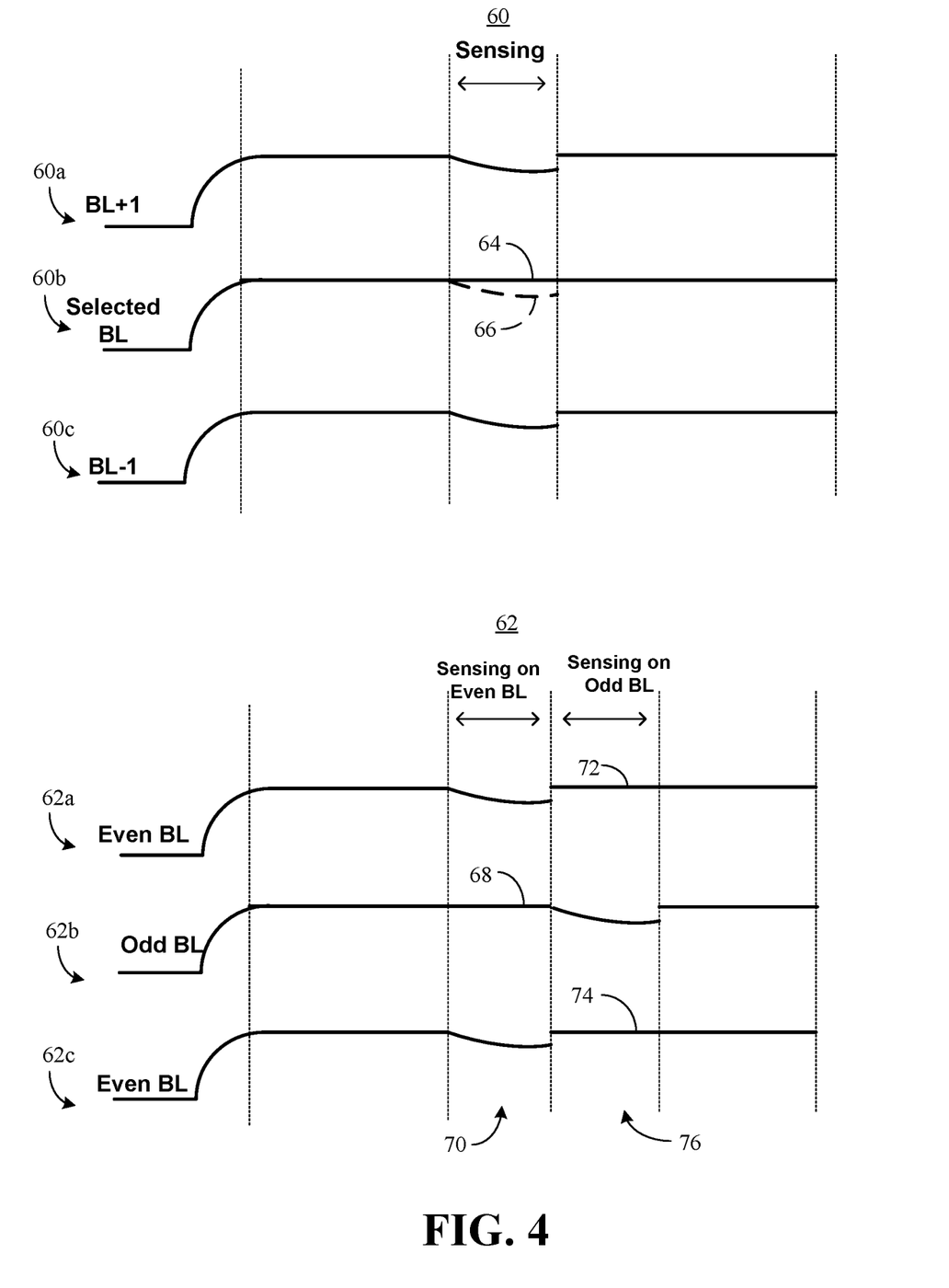
FIG. 4 is a comparative voltage level waveform diagram for an example of a conventional control scheme and a control scheme according to an embodiment.

FIG. 4 shows a conventional set 60 (60a-60c) of voltage waveforms and an enhanced set 62 (62a-62c) of voltage waveforms. In the illustrated conventional set 60, sensing-related fluctuations in a first voltage waveform 60a (corresponding to BL+1) and a third voltage waveform 60c (corresponding to BL−1) causes noise in a second voltage waveform 60b. For example, the second voltage waveform 60b fluctuates from an expected level 64 to an actual level 66. By contrast, the enhanced set 62 includes a first voltage waveform 62a (corresponding to an even BL) and a third voltage waveform 62c (corresponding to an even BL) having sensing-related fluctuations that do not cause a second voltage waveform 62b to fluctuate from an expected level 68 during an even sensing period 70. Similarly, a sensing-related fluctuation in the second voltage waveform 62b does not cause the first voltage waveform 62a or the third voltage waveform 62c to fluctuate from expected levels 72, 74 during an odd sensing period 76.

Figure 5:
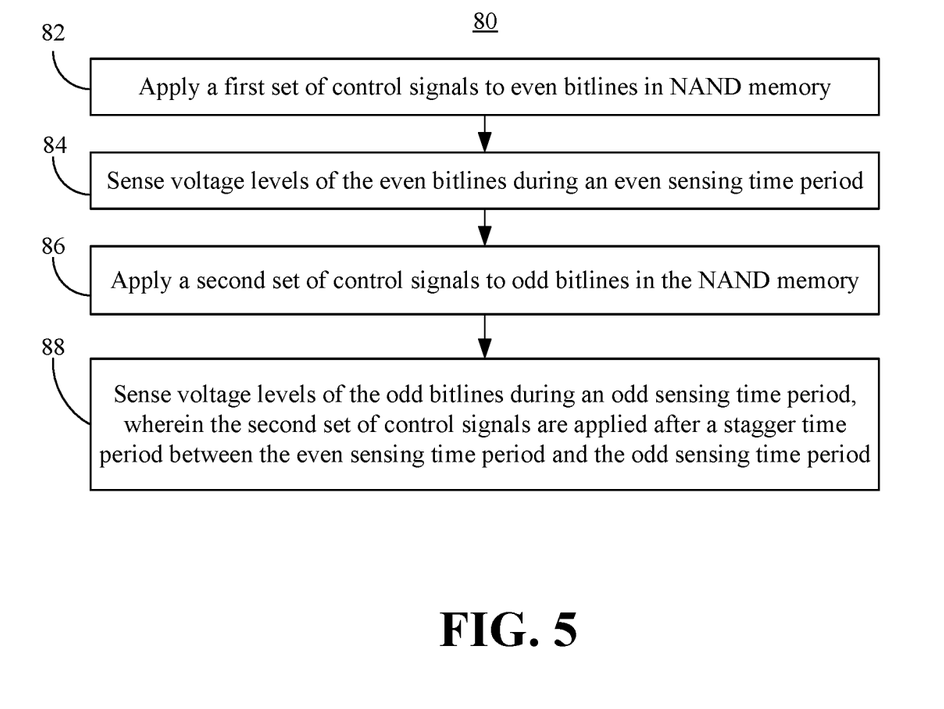
FIG. 5 is a flowchart of an example of a method of operating a memory chip controller according to an embodiment.

FIG. 5 shows a method 80 of operating a memory chip controller. The method 80 may be implemented in one or more modules as a set of logic instructions stored in a machine- or computer-readable storage medium such as random access memory (RAM), read only memory (ROM), programmable ROM (PROM), firmware, flash memory, etc., in configurable logic such as, for example, programmable logic arrays (PLAs), field programmable gate arrays (FPGAs), complex programmable logic devices (CPLDs), in fixed-functionality hardware logic using circuit technology such as, for example, application specific integrated circuit (ASIC), complementary metal oxide semiconductor (CMOS) or transistor-transistor logic (TTL) technology, or any combination thereof.

Illustrated processing block 82 applies a first set of control signals to even bitlines in NAND memory. In an embodiment, the first set of control signals include an even pre-charge signal that is shared by even pre-charge transistors and an even isolation signal that is shared by even isolation transistors. Moreover, the even pre-charge signal may deactivate the even pre-charge transistors and the even isolation signal may deactivate the even isolation transistors after the even pre-charge transistors have been deactivated. Block 84 may sense voltage levels of the even bitlines during an even sensing time period.

In one example, block 86 applies a second set of control signals to odd bitlines in the NAND memory. In an embodiment, the second set of control signals include an odd pre-charge signal that is shared by odd pre-charge transistors and an odd isolation signal that is shared by odd isolation transistors. In such a case, the odd pre-charge signal may deactivate the odd pre-charge transistors and the odd isolation signal may deactivate the odd isolation transistors after the odd pre-charge transistors have been deactivated. Block 88 may sense voltage levels of the odd bitlines during an odd sensing time period. In the illustrated example, the second set of control signals are applied after expiration of a stagger time period between the even sensing time period and the odd sensing time period. As already noted, application of the second set of control signals after expiration of the stabilization period reduces noise in the even bitlines and the odd bitlines.

Thus, the illustrated method 80 enhances performance at least to the extent that reduced neighboring bitline interference reduces read errors. Additionally, the even pre-charge signal may activate the even pre-charge transistors before the second set of control signals are applied to the odd bitlines. Such an approach eliminates any mismatch that may be present between the sensing of the even bitlines and the odd bitlines.

Figure 6:
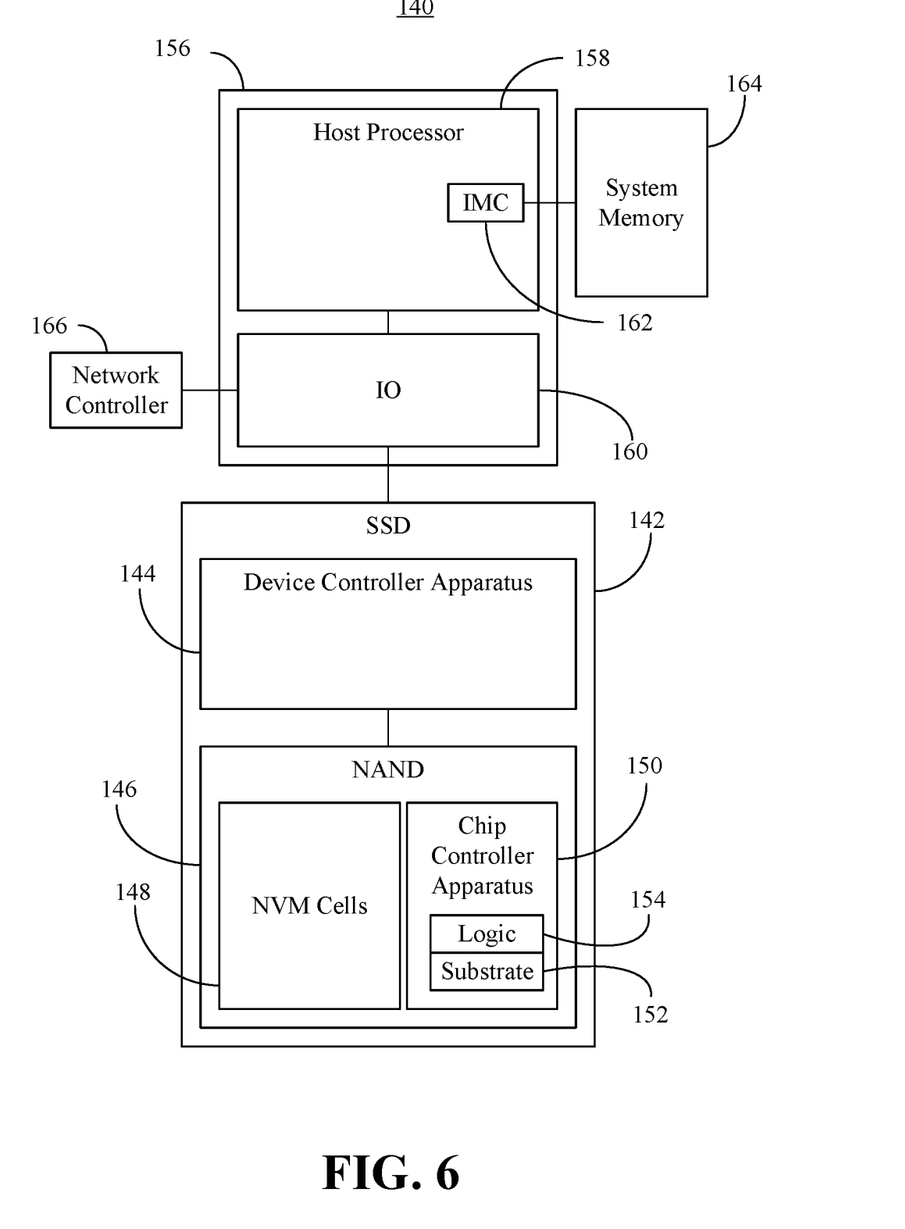
FIG. 6 is a block diagram of an example of a performance-enhanced computing system according to an embodiment.

Turning now to FIG. 6, a performance-enhanced computing system 140 is shown. In the illustrated example, a solid state drive (SSD) 142 includes a device controller apparatus 144 that is coupled to a NAND 146. The illustrated NAND 146 includes a set of NVM cells 148 (e.g., quad-level cell/QLC, PLC) and a chip controller apparatus 150 that includes a substrate 152 (e.g., silicon, sapphire, gallium arsenide) and logic 154 (e.g., transistor array and other integrated circuit/IC components) coupled to the substrate 152. The logic 154, which may include one or more of configurable or fixed-functionality hardware, may be configured to perform one or more aspects of the method 80 (FIG. 5), already discussed.

Thus, the logic 154 may apply a first set of control signals to NVM cells 148 (e.g., NAND memory) and sense voltage levels of the even bitlines during an even sensing time period. The logic 154 may also apply a second set of control signals to odd bitlines in the NVM cells 148. In an embodiment, the logic 154 senses voltage levels of the odd bitlines during an odd sensing time period. The second set of control signals may be applied after expiration of a stagger time period between the even sensing time period and the odd sensing time period. Although even bitlines are described herein as being read before odd bitlines for ease of discussion, the even/odd ordering may be reversed (e.g., odd bitlines may be read before even bitlines). In one example, the application of the second set of control signals after expiration of the stagger time period reduces noise in the even bitlines and the odd bitlines. The system 140 is therefore considered performance-enhanced at least to the extent that reduced neighboring bitline interference reduces read errors.

The illustrated system 140 also includes a system on chip (SoC) 156 having a host processor 158 (e.g., central processing unit/CPU) and an input/output (IO) module 160. The host processor 158 may include an integrated memory controller 162 (IMC) that communicates with system memory 164 (e.g., RAM dual inline memory modules/DIMMs). The illustrated IO module 160 is coupled to the SSD 142 as well as other system components such as a network controller 166.

In one example, the logic 154 includes transistor channel regions that are positioned (e.g., embedded) within the substrate 152. Thus, the interface between the logic 154 and the substrate 152 may not be an abrupt junction. The logic 154 may also be considered to include an epitaxial layer that is grown on an initial wafer of the substrate 152.

ADDITIONAL NOTES AND EXAMPLES

Example 1 includes a memory chip controller comprising one or more substrates and logic coupled to the one or more substrates, wherein the logic is at least partly implemented in one or more of configurable or fixed-functionality hardware, and the logic coupled to the one or more substrates is to apply a first set of control signals to even bitlines in NAND memory, sense voltage levels of the even bitlines during an even sensing time period, apply a second set of control signals to odd bitlines in the NAND memory, and sense voltage levels of the odd bitlines during an odd sensing time period, wherein the second set of control signals are applied after expiration of a stagger time period between the even sensing time period and the odd sensing time period.

Example 2 includes the memory chip controller of Example 1, wherein application of the second set of control signals after expiration of the stagger time period is to reduce noise in the even bitlines and the odd bitlines.

Example 3 includes the memory chip controller of Example 1, wherein the first set of control signals are to include an even pre-charge signal that is shared by even pre-charge transistors and an even isolation signal that is shared by even isolation transistors.

Example 4 includes the memory chip controller of Example 3, wherein the even pre-charge signal is to deactivate the even pre-charge transistors and the even isolation signal is to deactivate the even isolation transistors after the even pre-charge transistors have been deactivated.

Example 5 includes the memory chip controller of Example 4, wherein the even pre-charge signal is to activate the even pre-charge transistors before the second set of control signals are applied to the odd bitlines.

Example 6 includes the memory chip controller of any one of Examples 1 to 5, wherein the second set of control signals are to include an odd pre-charge signal that is shared by odd pre-charge transistors and an odd isolation signal that is shared by odd isolation transistors.

Example 7 includes the memory chip controller of Example 6, wherein the odd pre-charge signal is to deactivate the odd pre-charge transistors and the odd isolation signal is to deactivate the odd isolation transistors after the odd pre-charge transistors have been deactivated.

Example 8 includes a performance-enhanced computing system comprising a system on chip (SoC), and a solid state drive coupled to the SoC, the solid state drive including NAND memory and a memory chip controller, wherein the memory chip controller includes logic to apply a first set of control signals to even bitlines in the NAND memory, sense voltage levels of the even bitlines during an even sensing time period, apply a second set of control signals to odd bitlines in the NAND memory, and sense voltage levels of the odd bitlines during an odd sensing time period, wherein the second set of control signals are applied after expiration of a stagger time period between the even sensing time period and the odd sensing time period.

Example 9 includes the computing system of Example 8, wherein application of the second set of control signals after expiration of the stagger time period is to reduce noise in the even bitlines and the odd bitlines.

Example 10 includes the computing system of Example 8, wherein the first set of control signals are to include an even pre-charge signal that is shared by even pre-charge transistors and an even isolation signal that is shared by even isolation transistors.

Example 11 includes the computing system of Example 10, wherein the even pre-charge signal is to deactivate the even pre-charge transistors and the even isolation signal is to deactivate the even isolation transistors after the even pre-charge transistors have been deactivated.

Example 12 includes the computing system of Example 11, wherein the even pre-charge signal is to activate the even pre-charge transistors before the second set of control signals are applied to the odd bitlines.

Example 13 includes the computing system of any one of Examples 8 to 12, wherein the second set of control signals are to include an odd pre-charge signal that is shared by odd pre-charge transistors and an odd isolation signal that is shared by odd isolation transistors.

Example 14 includes the computing system of Example 13, wherein the odd pre-charge signal is to deactivate the odd pre-charge transistors and the odd isolation signal is to deactivate the odd isolation transistors after the odd pre-charge transistors have been deactivated.

Example 15 includes a method comprising applying a first set of control signals to even bitlines in NAND memory, sensing voltage levels of the even bitlines during an even sensing time period, applying a second set of control signals to odd bitlines in the NAND memory, and sensing voltage levels of the odd bitlines during an odd sensing time period, wherein the second set of control signals are applied after expiration of a stagger time period between the even sensing time period and the odd sensing time period.

Example 16 includes the method of Example 15, wherein application of the second set of control signals after expiration of the stagger time period reduces noise in the even bitlines and the odd bitlines.

Example 17 includes the method of Example 15, wherein the first set of control signals include an even pre-charge signal that is shared by even pre-charge transistors and an even isolation signal that is shared by even isolation transistors.

Example 18 includes the method of Example 17, wherein the even pre-charge signal deactivates the even pre-charge transistors and the even isolation signal deactivates the even isolation transistors after the even pre-charge transistors have been deactivated.

Example 19 includes the method of Example 18, wherein the even pre-charge signal activates the even pre-charge transistors before the second set of control signals are applied to the odd bitlines.

Example 20 includes the method of any one of Examples 15 to 19, wherein the second set of control signals include an odd pre-charge signal that is shared by odd pre-charge transistors and an odd isolation signal that is shared by odd isolation transistors, and wherein the odd pre-charge signal deactivates the odd pre-charge transistors and the odd isolation signal deactivates the odd isolation transistors after the odd pre-charge transistors have been deactivated.

Technology described herein therefore removes noise caused by neighboring BLs and improves the accuracy of $V_t$ read operations. For example, the total read time for each level might be ~20 μS depending on the level and $t_{Sense}$ may be ~1.89 μS, which is negligible compared to the total read time. Thus, even though sensing on neighboring BLs is staggered, the $t_{Read}$ penalty is negligible compared to shielded ABL.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A memory chip controller comprising:
   one or more substrates; and
   logic coupled to the one or more substrates, wherein the logic is at least partly implemented in one or more of configurable or fixed-functionality hardware, and the logic coupled to the one or more substrates is to:
   apply a first set of control signals to even bitlines in NAND memory, wherein the first set of control signals are to include an even pre-charge signal that is shared by even pre-charge transistors;
   sense voltage levels of the even bitlines during an even sensing time period;
   apply a second set of control signals to odd bitlines in the NAND memory; and
   sense voltage levels of the odd bitlines during an odd sensing time period, wherein the second set of control signals are applied after expiration of a stagger time period between the even sensing time period and the odd sensing time period, and wherein the even pre-charge signal activates the even pre-charge transistors from a deactivated state during the stagger time period.

2. The memory chip controller of claim 1, wherein application of the second set of control signals after expiration of the stagger time period is to reduce noise in the even bitlines and the odd bitlines.

3. The memory chip controller of claim 1, wherein the first set of control signals are to include an even isolation signal that is shared by even isolation transistors.

4. The memory chip controller of claim 3, wherein the even pre-charge signal is to deactivate the even pre-charge transistors and the even isolation signal is to deactivate the even isolation transistors after the even pre-charge transistors have been deactivated.

5. The memory chip controller of claim 4, wherein the even pre-charge signal is to activate the even pre-charge transistors before the second set of control signals are applied to the odd bitlines.

6. The memory chip controller of claim 1, wherein the second set of control signals are to include an odd pre-charge signal that is shared by odd pre-charge transistors and an odd isolation signal that is shared by odd isolation transistors.

7. The memory chip controller of claim 6, wherein the odd pre-charge signal is to deactivate the odd pre-charge transistors and the odd isolation signal is to deactivate the odd isolation transistors after the odd pre-charge transistors have been deactivated.

8. A computing system comprising:
   a system on chip (SoC); and
   a solid state drive coupled to the SoC, the solid state drive including NAND memory and a memory chip controller, wherein the memory chip controller includes logic to:
   apply a first set of control signals to even bitlines in the NAND memory, wherein the first set of control signals are to include an even pre-charge signal that is shared by even pre-charge transistors,
   sense voltage levels of the even bitlines during an even sensing time period,
   apply a second set of control signals to odd bitlines in the NAND memory, and
   sense voltage levels of the odd bitlines during an odd sensing time period, wherein the second set of control signals are applied after expiration of a stagger time period between the even sensing time period and the odd sensing time period, and wherein the even pre-charge signal activates the even pre-charge transistors from a deactivated state during the stagger time period.

9. The computing system of claim 8, wherein application of the second set of control signals after expiration of the stagger time period is to reduce noise in the even bitlines and the odd bitlines.

10. The computing system of claim 8, wherein the first set of control signals are to include an even isolation signal that is shared by even isolation transistors.

11. The computing system of claim 10, wherein the even pre-charge signal is to deactivate the even pre-charge transistors and the even isolation signal is to deactivate the even isolation transistors after the even pre-charge transistors have been deactivated.

12. The computing system of claim 11, wherein the even pre-charge signal is to activate the even pre-charge transistors before the second set of control signals are applied to the odd bitlines.

13. The computing system of claim 8, wherein the second set of control signals are to include an odd pre-charge signal that is shared by odd pre-charge transistors and an odd isolation signal that is shared by odd isolation transistors.

14. The computing system of claim 13, wherein the odd pre-charge signal is to deactivate the odd pre-charge transistors and the odd isolation signal is to deactivate the odd isolation transistors after the odd pre-charge transistors have been deactivated.

15. A method comprising:
  applying a first set of control signals to even bitlines in NAND memory, wherein the first set of control signals are to include an even pre-charge signal that is shared by even pre-charge transistors;
  sensing voltage levels of the even bitlines during an even sensing time period;
  applying a second set of control signals to odd bitlines in the NAND memory; and
  sensing voltage levels of the odd bitlines during an odd sensing time period, wherein the second set of control signals are applied after expiration of a stagger time period between the even sensing time period and the odd sensing time period, and wherein the even pre-charge signal activates the even pre-charge transistors from a deactivated state during the stagger time period.

16. The method of claim 15, wherein application of the second set of control signals after expiration of the stagger time period reduces noise in the even bitlines and the odd bitlines.

17. The method of claim 15, wherein the first set of control signals include an even isolation signal that is shared by even isolation transistors.

18. The method of claim 17, wherein the even pre-charge signal deactivates the even pre-charge transistors and the even isolation signal deactivates the even isolation transistors after the even pre-charge transistors have been deactivated.

19. The method of claim 18, wherein the even pre-charge signal activates the even pre-charge transistors before the second set of control signals are applied to the odd bitlines.

20. The method of claim 15, wherein the second set of control signals include an odd pre-charge signal that is shared by odd pre-charge transistors and an odd isolation signal that is shared by odd isolation transistors, and wherein the odd pre-charge signal deactivates the odd pre-charge transistors and the odd isolation signal deactivates the odd isolation transistors after the odd pre-charge transistors have been deactivated.

* * * * *